US010295206B2

(12) United States Patent
Zhang et al.

(10) Patent No.: US 10,295,206 B2
(45) Date of Patent: May 21, 2019

(54) GRAVITY-ASSISTED HEAT PIPE GROUND COOLING SOURCE COLD STORAGE SYSTEM AND CHILLER SET

(71) Applicant: NANJING CANATAL DATA-CENTRE ENVIRONMENTAL TECH. CO., LTD., Nanjing (CN)

(72) Inventors: Weixing Zhang, Nanjing (CN); Zongqin Zhang, Nanjing (CN); Jun Tian, Nanjing (CN); Yi Yuan, Nanjing (CN); Lingyun Wang, Nanjing (CN)

(73) Assignee: NANJING CANATAL DATA-CENTRE ENVIRONMENTAL TECH. CO., LTD., Nanjing (CN)

( * ) Notice: Subject to any disclaimer, the term of this patent is extended or adjusted under 35 U.S.C. 154(b) by 0 days.

(21) Appl. No.: 15/751,482

(22) PCT Filed: Jul. 1, 2016

(86) PCT No.: PCT/CN2016/088061
§ 371 (c)(1),
(2) Date: Feb. 9, 2018

(87) PCT Pub. No.: WO2017/045458
PCT Pub. Date: Mar. 23, 2017

(65) Prior Publication Data
US 2018/0231265 A1 Aug. 16, 2018

(30) Foreign Application Priority Data
Sep. 18, 2015 (CN) .......................... 2015 1 0596481

(51) Int. Cl.
*F24F 5/00* (2006.01)
*F25B 30/06* (2006.01)
(Continued)

(52) U.S. Cl.
CPC .............. *F24F 5/0046* (2013.01); *F24F 5/00* (2013.01); *F24F 5/0017* (2013.01); *F24T 10/00* (2018.05);
(Continued)

(58) Field of Classification Search
CPC ...... F24F 5/0021; F24F 5/0046; F24F 5/0017; F24F 5/00; F25B 29/006; F25B 29/003;
(Continued)

(56) References Cited

FOREIGN PATENT DOCUMENTS

CN 202328583 U 7/2012
CN 102759222 A 10/2012
(Continued)

*Primary Examiner* — Emmanuel E Duke
(74) *Attorney, Agent, or Firm* — Gokalp Bayramoglu

(57) ABSTRACT

A gravity-assisted heat pipe ground cooling source cold storage system and a chiller set. The cold storage system includes a gravity-assisted heat pipe, a cold storage pool, a heat exchanging and cold condensing device, and a heat exchanger pipe. An inlet and outlet of the cold storage pool are parallel-connected to cold water pipes of a chiller set, and are connected or disconnected via control valves. The heat exchanger pipe is buried underground, and includes a flow inlet pipe and a flow return pipe having a cross section including a first arc, a second arc, a third arc, and a fourth arc. The second arc and the fourth arc are S-shaped arcs. The first arc has a radius exceeding that of the third arc, and centers of circles of the first arc and third arc are located at the cross section of the flow return pipe.

10 Claims, 3 Drawing Sheets

(51) Int. Cl.

| | |
|---|---|
| ***F24T 10/00*** | (2018.01) |
| ***F28D 15/02*** | (2006.01) |
| ***F28D 20/00*** | (2006.01) |
| ***H05K 7/20*** | (2006.01) |
| ***F25B 23/00*** | (2006.01) |
| *F28D 20/02* | (2006.01) |

(52) U.S. Cl.

CPC ............ *F25B 23/006* (2013.01); *F25B 30/06* (2013.01); *F28D 15/025* (2013.01); *F28D 15/0266* (2013.01); *F28D 20/00* (2013.01); *H05K 7/20827* (2013.01); *F28D 20/0034* (2013.01); *F28D 20/02* (2013.01); *Y02B 10/40* (2013.01); *Y02E 10/10* (2013.01); *Y02E 60/147* (2013.01)

(58) Field of Classification Search

CPC ........ F25B 30/06; F28D 15/025; F25D 16/00; F24T 10/00; Y02E 10/10

See application file for complete search history.

(56) References Cited

FOREIGN PATENT DOCUMENTS

| | | | |
|---|---|---|---|
| CN | 203147942 | U | 8/2013 |
| CN | 103968607 | A | 8/2014 |
| CN | 105115083 | A | 12/2015 |
| CN | 204987334 | U | 1/2016 |
| JP | H11182942 | A | 7/1999 |
| WO | 2013017730 | A1 | 2/2013 |

GRAVITY-ASSISTED HEAT PIPE GROUND COOLING SOURCE COLD STORAGE SYSTEM AND CHILLER SET

CROSS REFERENCE TO RELATED APPLICATIONS

This application is the national phase entry of International Application No. PCT/CN2016/088061, filed on Jul. 1, 2016, which is based upon and claims priority to Chinese Application No. 201510596481.1 filed on Sep. 18, 2015, the entire contents of which are incorporated herein by reference.

TECHNICAL FIELD

The invention relates to a gravity-assisted heat pipe ground cooling source cold storage system.

BACKGROUND

In the prior art, data centers have higher requirements for the sustainable refrigerating capacity of chiller sets. When the external power supply fails, the UPS can be used for supplying power for IT equipment and generally can't supply power for air conditioning equipment which also has great power consumption, but it can supply power for draught fans, water pumps and other devices having small power consumption. Besides, in order to solve the problem of cold storage for data centers, the large-size cold storage tank having huge size and occupying huge space is added in the water system, and it brings troubles for heat insulation and load bearing; furthermore, such system is not energy-saving. It is considered in the viewpoints of providing cold after power failure and reducing the volume of cold storage equipment.

Therefore, a new cold storage system is needed to solve the above problems.

SUMMARY OF THE INVENTION

Purpose

The invention provides an energy-saving and high-efficiency gravity-assisted heat pipe ground cooling source cold storage system and a chiller set aiming at the defects of chiller sets in the prior art, and it makes effective use of the nature cold sources and can sustainably supply cold sources.

Technical Solution

In order to solve the above technical problems, the gravity-assisted heat pipe cooling source cold storage system of the invention adopts the following technical solution: a gravity-assisted heat pipe ground cooling source cold storage system for a chiller set, the chiller set is provided with cold water pipes, and the cold storage system comprises a gravity-assisted heat pipe, a cold storage pool and a heat exchanging and cold condensing device; the heat exchanger pipe is buried underground, the heat exchanger pipe comprises a flow inlet pipe and a flow return pipe, the upper ends of the flow inlet pipe and the flow return pipe are communicated with the inlet and the outlet of the heat exchanging and cold condensing device via heat insulating pipes, respectively, the outer wall of the flow inlet pipe is connected with the outer wall of the flow return pipe, the flow inlet pipe is mutually parallel with the flow return pipe, the flow inlet pipe comprises four pipes having circular cross sections, and the cross section of the flow return pipe is formed by a first arc, a second arc, a third arc and a fourth arc connected sequentially to one another, wherein, the second arc and the fourth arc are S-shaped arcs, the first arc has a radius larger than that of the third arc, the centers of circles of the first arc and the third arc are located at the cross section of the flow return pipe, and the flow inlet pipe is arranged around third arc.

Further, the cross section areas of the flow inlet pipe are all the same.

Further, the sum of cross section areas of the flow inlet pipe is greater than the cross section area of the flow return pipe.

Further, the entire outer diameter of the heat exchanger pipe is 80±0.5 mm, and the wall thicknesses of the flow return pipe and the side pipe are 3±0.5 mm.

Further, the inner wall of the flow return pipe at the end close to the ground shall be heat-insulated or provided with a heat insulating pipe sleeve inside.

Further, the cross section area of the flow return pipe is 50-60% of the sum of the cross section areas of the flow inlet pipe.

Further, the refrigerant can be water, an ethanediol aqueous solution and a 30%~45% calcium chloride aqueous solution, or an aqueous solution containing 20%~40% decahydrate sodium sulfate and 15%~25% trihydrate sodium acetate, or an aqueous solution containing 20%~40% decahydrate sodium sulfate and 15%~30% calcium chloride.

The cold storage medium has a phase-transition temperature of 5~20° C., so that its latent heat of phase change can be effectively used under the environment of higher temperature.

Further, the heat exchanging and cold condensing device is a water cooling device, an air cooling device or a spraying evaporation heat exchanging and cold condensing device. The heat exchanger pipe of the invention can be used to realize various cooling modes of the gravity-assisted heat pipe. Wherein, the water cooling device can be realized just by a cold water pool.

Beneficial effect: The gravity-assisted heat pipe cooling source cold storage system of the invention employs the heat exchanger pipe to provide cold source for the gravity-assisted heat pipe, and the heat exchanger pipe can make full use of the heat exchange area in the drilling well, so that the heat exchanger pipe can keep in contact with the well wall in a large area to effectively improve the cold absorption efficiency of the heat exchanger pipe.

The invention also discloses a chiller set for a gravity-assisted heat pipe ground cooling source cold storage system, comprising the gravity-assisted heat pipe ground cooling source cold storage system in any of claims 1-7, and the cold storage pool is parallel-connected to the chiller set.

Further, the cold storage pool is connected with the chiller set via a three-way valve. Such design can simply and conveniently realize controlling the medium to flow through the chiller set or the cold storage pool.

Beneficial Effect

The chiller set for the gravity-assisted heat pipe cooling source cold storage system of the invention employs the gravity-assisted heat pipe cooling source cold storage system to provide the cold storage system for the chiller set, and the gravity-assisted heat pipe cooling source cold storage system of the invention employs the heat exchanger pipe to provide the cold source for the gravity-assisted heat pipe, and the heat exchanger pipe can make full use of the heat exchange area in the drilling well, so that the heat exchanger pipe can keep in contact with the well wall in a large area to effectively improve the cold absorption efficiency of the heat exchanger pipe.

DETAILED DESCRIPTION

The invention is further described by combining with the drawings and specific embodiments below, it shall be understood that these embodiments are only used for explaining the invention but not for limiting the range of the invention, and after reading the invention, the modification in various equivalent forms of the invention by the technicians of this field are all within the range defined by the claims attached to the application.

Figure 1:
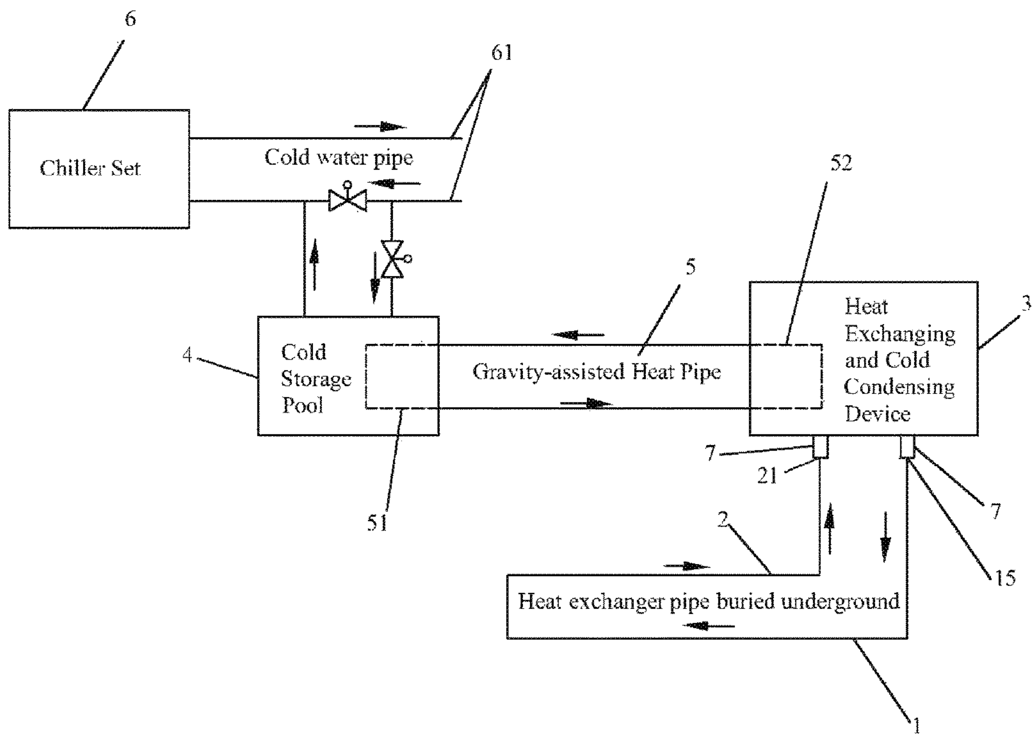
FIG. 1 shows the structural diagram of the gravity-assisted heat pipe ground cooling source cold storage system of the invention.
Figure 2:
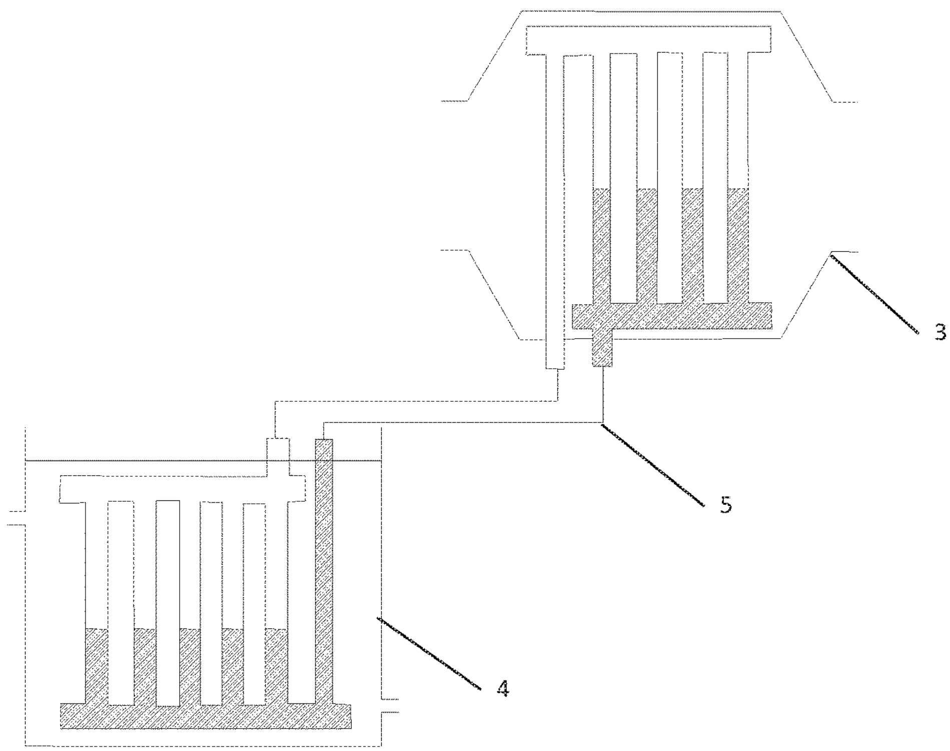
FIG. 2 shows the structural diagram of the gravity-assisted heat pipe of the invention.
Figure 3:
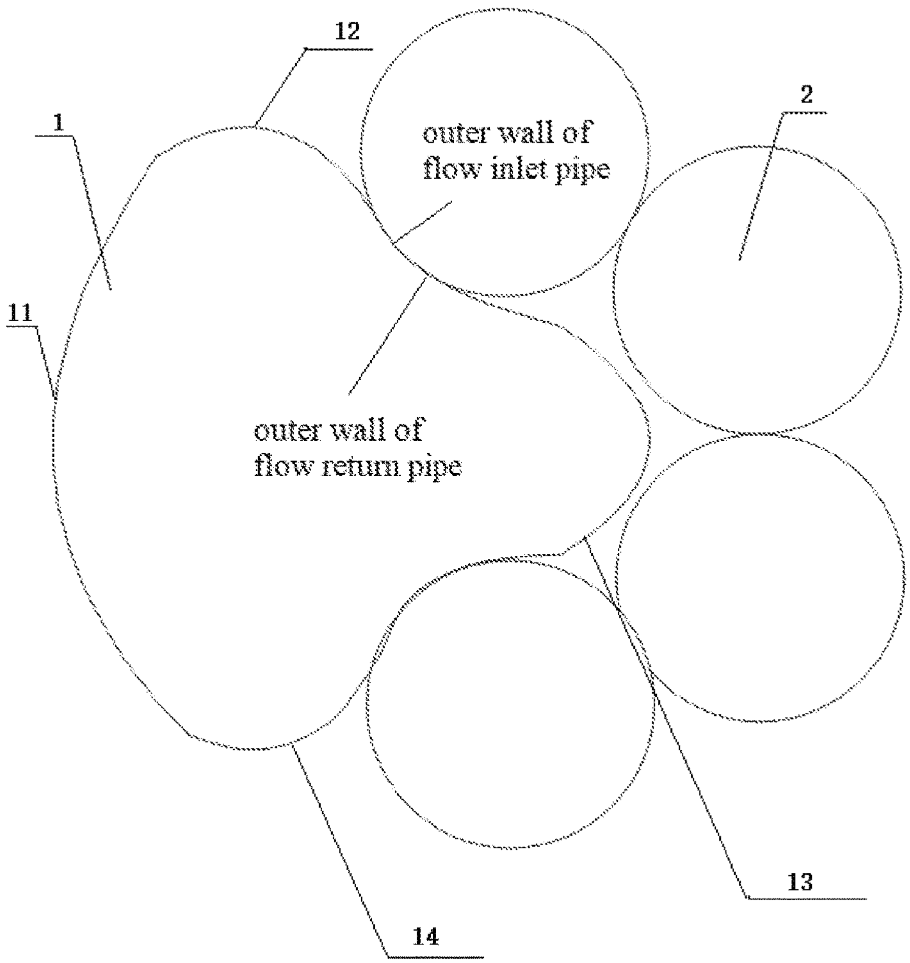
FIG. 3 shows the structural diagram of the heat exchanger pipe of the invention.

Please refer to FIG. 1, FIG. 2 and FIG. 3, in the gravity-assisted heat pipe cooling source cold storage system of the invention, the cold storage system is applied for the chiller set 6. The chiller set 6 is provided with cold water pipes 61, comprising a gravity-assisted heat pipe 5, a cold storage pool 4, a heat exchanging and cold condensing device 3 and a heat exchanger pipe; an inlet and an outlet of the cold storage pool are parallel-connected to cold water pipes 61 of the chiller set 6, and are connected or disconnected via control valves; the gravity-assisted heat pipe is a separating heat pipe, a evaporating segment 51 of which is arranged in the cold storage pool 4 and a condensing segment 52 is arranged in the heat exchanging and cold condensing device 3.

The cold storage system comprises a gravity-assisted heat pipe 5, a cold storage pool 4, a heat exchanging and cold condensing device 3 and a heat exchanger pipe, the lower end of the gravity-assisted heat pipe 5 is arranged in the cold storage pool 4, and the upper end of the gravity-assisted heat pipe 5 is arranged in the heat exchanging and cold condensing device 3. Wherein, the cold storage pool 4 is parallel-connected to the chiller set 6. When the chiller set 6 breaks down or has power failure, the cold storage pool 4 can be used for sustainably providing the cold.

The cold storage medium is stored in the cold storage pool 4, and the cold storage medium can be water, a 5%~25% calcium chloride aqueous solution, or an aqueous solution containing 3%~10% decahydrate sodium sulfate and 5%~12% trihydrate sodium acetate, or an aqueous solution containing 5%~15% calcium chloride and 5%~10% sodium phosphate. The cold storage medium has the phase-transition temperature at 5~20° C., so that its latent heat of phase change can be effectively used under the environment of higher temperature.

The heat exchanger pipe of the invention is buried underground, and comprises a flow inlet pipe 2 and a flow return pipe 1, an upper end 21 of the flow inlet pipe 2 and an upper end 15 of the flow return pipe 1 are communicated with both ends of the heat exchanging and cold condensing device 3 via the heat insulating pipes 7, respectively, the outer wall of each flow inlet pipe 2 is connected with the outer wall of the flow return pipe 1, the flow inlet pipe 2 are mutually parallel with the flow return pipe 1, the flow inlet pipe 2 comprises four pipes with circular cross sections, and the cross section of the flow return pipe 1 is formed by a first arc 11, a second arc 12, a third arc 13 and a fourth arc 14 connected sequentially to one another, wherein, the second arc 12 and the fourth arc 14 are S-shaped arcs, the first arc 11 has a radius larger than that of the third arc 13, both ends of the first arc 11 are connected with both ends of the third arc 13 via the second arc 12 and the fourth arc 14, respectively, the centers of circles of the first arc 11 and the third arc 13 are located at the cross section of the flow return pipe 1, and the flow inlet pipe 2 is arranged around the third arc 13.

The above design enables the heat exchanger pipe to make full use of the heat exchange area in the drilling well, so that the heat exchanger pipe can keep in contact with the well wall in a large area to effectively improve the cold absorption efficiency of the heat exchanger pipe. In this embodiment, the cross section areas of the flow inlet pipe 1 are all the same. The sum of cross section areas of the flow inlet pipe 2 is greater than the cross section area of the flow return pipe 1.

The entire outer diameter of the heat exchanger pipe is 80±0.5 mm, and the wall thicknesses of the flow return pipe 1 and the flow inlet pipe 2 are both 3±0.5 mm. The inner wall of the flow return pipe 1 at the end close to the ground shall be heat-insulated or provided with a heat insulating pipe sleeve inside.

The cross section area of the flow return pipe 1 is 50-60% of the sum of the cross section areas of the flow inlet pipe 2. The design can greatly reduce the pipe pressure of the flow inlet pipe of the heat exchanger pipe. It can ensure the fluid to flow slowly when it flows into the pipe, stay for a long time and absorb more heat. Owing to the small back-flow cross section area, the fluid after heat exchange at the bottom can rapidly return to the ground to avoid the return fluid from the heat interference by the flow inlet pipe. Preferably, the cross section of the central pipe 1 is 50-60% of the sum of the cross section areas of the side pipe 1.

Preferably, the outer pipe walls of the flow inlet pipe 2 and the flow return pipe 1 are provided with grooves. The grooves can be arranged along the axial direction of the flow inlet pipe 2 and the flow return pipe 1. Wherein, the grooves are uniformly distributed on the outer pipe walls of the flow inlet pipe 2 and the flow return pipe 1. The lengths of the grooves are the same as the lengths of the flow inlet pipe 2 and the flow return pipe 1. The grooves arranged on the flow inlet pipe 2 and the flow return pipe 1 are used for increasing the surface areas of the flow inlet pipe 2 and the flow return pipe 1, so that they can absorb heat more efficiently to improve the heat exchange efficiency of the heat exchanger pipe. It can make full use of the heat exchange area in the drilling well, so that the heat exchanger pipe can keep in contact with the well wall in a large area to effectively improve the cold absorption efficiency of the heat exchanger pipe. The inner wall of the central pipe 1 at the end close to the ground shall be heat-insulated or provided with heat insulating pipe sleeve. For the part close to the ground surface, there is great heat interference between the flow inlet pipe and the flow return pipe, and the heat exchange efficiency can be improved by insulating the contact surface of the cavity at the upper end close to the ground of the flow return pipe or inserting a heat-insulating sleeve. In order to ensure the service life longer than 50 years, the heat exchanger pipe shall be made of high-density polyethylene or polypropylene. The entire outer diameter of the heat exchanger pipe is 80±0.5 mm, and the wall thicknesses of the flow inlet pipe 2 and the flow return pipe 1 are both 3±0.5 mm.

The invention also discloses a chiller set 6 for gravity-assisted heat pipe cooling source cold storage system, by adopting the above gravity-assisted heat pipe cooling source cold storage system, the cold storage pool 4 is parallel-connected to the chiller set 6. The cold storage pool 4 is connected with the chiller set 6 via a three-way valve. Such design can simply and conveniently realize controlling the medium to flow through the chiller set 6 or the cold storage pool.

The chiller set 6 for gravity-assisted heat pipe cooling source cold storage system of the invention employs the gravity-assisted heat pipe cooling source cold storage system to provide the cold storage system for the chiller set 6, besides, the gravity-assisted heat pipe cooling source cold storage system of the invention employs the heat exchanger pipe to provide the cold source for the gravity-assisted heat pipe, and the heat exchanger pipe can make full use of the heat exchange area in the drilling well, so that the heat exchanger pipe can keep in contact with large area of the well wall to effectively improve the cold absorption efficiency of the heat exchanger pipe. At the same time, both the flow inlet pipe and the flow return pipe of the heat exchanger pipe of the invention can contact with the well wall to absorb the cold, and it can greatly extend the acting distance of the heat exchanger pipe to improve the effect of cold absorption.

The Principles are as Below:

Process of Cold Storage:

When the gravity-assisted heat pipe is in operation, the secondary refrigerant (working medium, usually Freon is adopted) in the heat pipe circulates between the outdoor heat exchanging and cold condensing device and the cold storage pool 4 by discharging heat in the heat exchanging and cold condensing device 3 and absorbing heat in the cold storage pool 4, so that the temperature of the cold storage medium in the cold storage pool 4 is reduced, and even the refrigerant medium has phase change to store heat.

Process of Releasing Cold:

When it is necessary to release cold, open the on-off valve to enable the inflow water of the chiller set 6 to firstly flow through the cold storage pool 4, the water and the medium in the cold storage pool 4 exchanges heat to reduce the water temperature of the chiller set 6. The process of releasing cold is realized.

The chiller set 6 for gravity-assisted heat pipe cooling source cold storage system of the intervention employs the gravity-assisted heat pipe cooling source cold storage system to provide the cold storage system for the chiller set 6, besides, the gravity-assisted heat pipe cooling source cold storage system of the invention employs the heat exchanger pipe to provide the cold source for the gravity-assisted heat pipe, and the heat exchanger pipe can make full use of the heat exchange area in the drilling well, so that the heat exchanger pipe can keep in contact with large area of the well wall to effectively improve the cold absorption efficiency of the heat exchanger pipe and utilize the underground cold source to the maximum.

The invention claimed is:

1. A cold storage system, comprising:

a chiller set, wherein the chiller set is provided with cold water pipes;

a gravity-assisted heat pipe, a cold storage pool, a heat exchanging and cold condensing device and a heat exchanger pipe;

wherein an inlet and an outlet of the cold storage pool are parallelly connected to the cold water pipes of the chiller set, and are connected or disconnected via control valves; the gravity-assisted heat pipe is a separating heat pipe, an evaporating segment of the gravity-assisted heat pipe is arranged in the cold storage pool and a condensing segment is arranged in the heat exchanging and cold condensing device; the heat exchanger pipe is buried underground, and comprises a flow inlet pipe and a flow return pipe, an upper end of the flow inlet pipe and an upper end of the flow return pipe are connected with an inlet and an outlet of the heat exchanging and cold condensing device via heat insulating pipes to form a circulation; an outer wall of the flow inlet pipe is connected with an outer wall of the flow return pipe, the flow inlet pipe is mutually parallel with the flow return pipe, the flow inlet pipe comprises four pipes having circular cross sections, and a cross section of the flow return pipe is formed by a first arc, a second arc, a third arc and a fourth arc connected sequentially to one another, wherein, the second arc and the fourth arc are S-shaped arcs, the first arc has a radius larger than that of the third arc, centers of circles of the first arc and the third arc are located at a cross section of the flow return pipe, and the flow inlet pipe is arranged around the third arc.

2. The cold storage system according to claim 1, wherein cross section areas of the flow inlet pipe are all the same.

3. The cold storage system according to claim 1, wherein sum of the cross section areas of the flow inlet pipe is greater than a cross section area of the flow return pipe.

4. The cold storage system according to claim 1, wherein an entire outer diameter of the heat exchanger pipe is 80±0.5 mm, and a wall thicknesses of the flow inlet pipe and the flow return pipe are 3±0.5 mm.

5. The cold storage system according to claim 1, wherein an inner wall of the flow return pipe at an end close to the ground is heat-insulated or provided with a heat insulating pipe sleeve inside.

6. The cold storage system according to claim 1, wherein a cross section area of the flow return pipe is 50-60% of the sum of the cross section areas of the flow inlet pipe.

7. The cold storage system according to claim 1, wherein a cold storage medium is stored in the cold storage pool, the cold storage medium is water, an ethanediol aqueous solution, a 30%~45% calcium chloride aqueous solution, or an aqueous solution containing 20%~40% decahydrate sodium sulfate and 15%~25% trihydrate sodium acetate, or an aqueous solution containing 20%~40% decahydrate sodium sulfate and 15%~30% calcium chloride solution.

8. The cold storage system according to claim 1, wherein the heat exchanging and cold condensing device is a water cooling device, an air cooling device or a spraying evaporation heat exchanging and cold condensing device.

9. A chiller set for a cold storage system, wherein the cold storage system comprises a gravity-assisted heat pipe, a cold storage pool, a heat exchanging and cold condensing device and a heat exchanger pipe;

wherein an inlet and an outlet of the cold storage pool are parallelly connected to the cold water pipes of the chiller set, and are connected or disconnected via control valves; the gravity-assisted heat pipe is a separating heat pipe, an evaporating segment of the gravity-assisted heat pip is arranged in the cold storage pool and a condensing segment is arranged in the heat exchanging and cold condensing device; the heat exchanger pipe is buried underground, and comprises a flow inlet pipe and a flow return pipe, an upper end of the flow inlet pipe and an upper end of the flow return pipe are connected with an inlet and an outlet of the heat exchanging and cold condensing device via heat insulating pipes to form a circulation; an outer wall of the flow inlet pipe is connected with an outer wall of the flow return pipe, the flow inlet pipe is mutually parallel with the flow return pipe, the flow inlet pipe comprises four pipes having circular cross sections, and a cross section of the flow return pipe is formed by a first arc, a second arc, a third arc and a fourth arc connected sequentially to one another, wherein, the second arc and the fourth arc are S-shaped arcs, the first arc has a radius larger than that of the third arc, centers of circles of the first arc and the third arc are located at a cross section of the flow return pipe, and the flow inlet pipe is arranged around the third arc; and the cold storage pool is parallel-connected to the chiller set.

10. The chiller set for a cold storage system according to claim 9, wherein the cold storage pool is connected with the chiller set via a three-way valve.

* * * * *